United States Patent
Sekimoto

(10) Patent No.: US 11,599,130 B2
(45) Date of Patent: Mar. 7, 2023

(54) POWER RECEIVING APPARATUS AND CONTROL METHOD

(71) Applicant: CANON KABUSHIKI KAISHA, Tokyo (JP)

(72) Inventor: Ryota Sekimoto, Tokyo (JP)

(73) Assignee: CANON KABUSHIKI KAISHA, Tokyo (JP)

( * ) Notice: Subject to any disclaimer, the term of this patent is extended or adjusted under 35 U.S.C. 154(b) by 0 days.

(21) Appl. No.: 17/444,766

(22) Filed: Aug. 10, 2021

(65) Prior Publication Data

US 2022/0057821 A1  Feb. 24, 2022

(30) Foreign Application Priority Data

Aug. 20, 2020 (JP) .............................. JP2020-139442

(51) Int. Cl.
*G05F 1/46* (2006.01)
*G01R 31/40* (2020.01)

(52) U.S. Cl.
CPC .............. *G05F 1/46* (2013.01); *G01R 31/40* (2013.01)

(58) Field of Classification Search
CPC ....... G05F 1/12; G08C 17/02; G08C 2201/10; H02J 3/00
See application file for complete search history.

(56) References Cited

U.S. PATENT DOCUMENTS

| | | |
|---|---|---|
| 2015/0028690 A1 | 1/2015 | Sako et al. |
| 2018/0081326 A1* | 3/2018 | Degura ................. G05B 11/01 |
| 2018/0341315 A1* | 11/2018 | Suganuma .............. G06F 1/266 |
| 2019/0064900 A1* | 2/2019 | Lee ......................... G06F 1/266 |
| 2019/0115765 A1* | 4/2019 | Lai .......................... H02M 3/07 |

FOREIGN PATENT DOCUMENTS

| | | |
|---|---|---|
| JP | 2013-198214 A | 9/2013 |
| WO | 2013/136686 A2 | 9/2013 |

OTHER PUBLICATIONS

Application Report SLVA842, USB PD Power Negotiations by Texas Instruments Incorporated, Published on Nov. 2016 (Year: 2016).*

\* cited by examiner

*Primary Examiner* — Toan T Vu
*Assistant Examiner* — Thai H Tran
(74) *Attorney, Agent, or Firm* — Cowan, Liebowitz & Latman, P.C.

(57) ABSTRACT

A power receiving apparatus controls a power receiving unit to receive a first power from the power transmitting apparatus without performing a determination process of determining whether or not the power transmitting apparatus meets a predetermined condition in a case where the power receiving apparatus is in a first operation state. The power receiving apparatus performs the determination process of determining whether or not the power transmitting apparatus meets the predetermined condition before the power receiving unit receives a second power higher than the first power from the power transmitting apparatus in a case where the power receiving apparatus is in a second operation state. The power receiving apparatus controls the power receiving unit to receive the second power from the power transmitting apparatus in a case where the power receiving apparatus is in the second operation state and the power transmitting apparatus meets the predetermined condition.

13 Claims, 10 Drawing Sheets

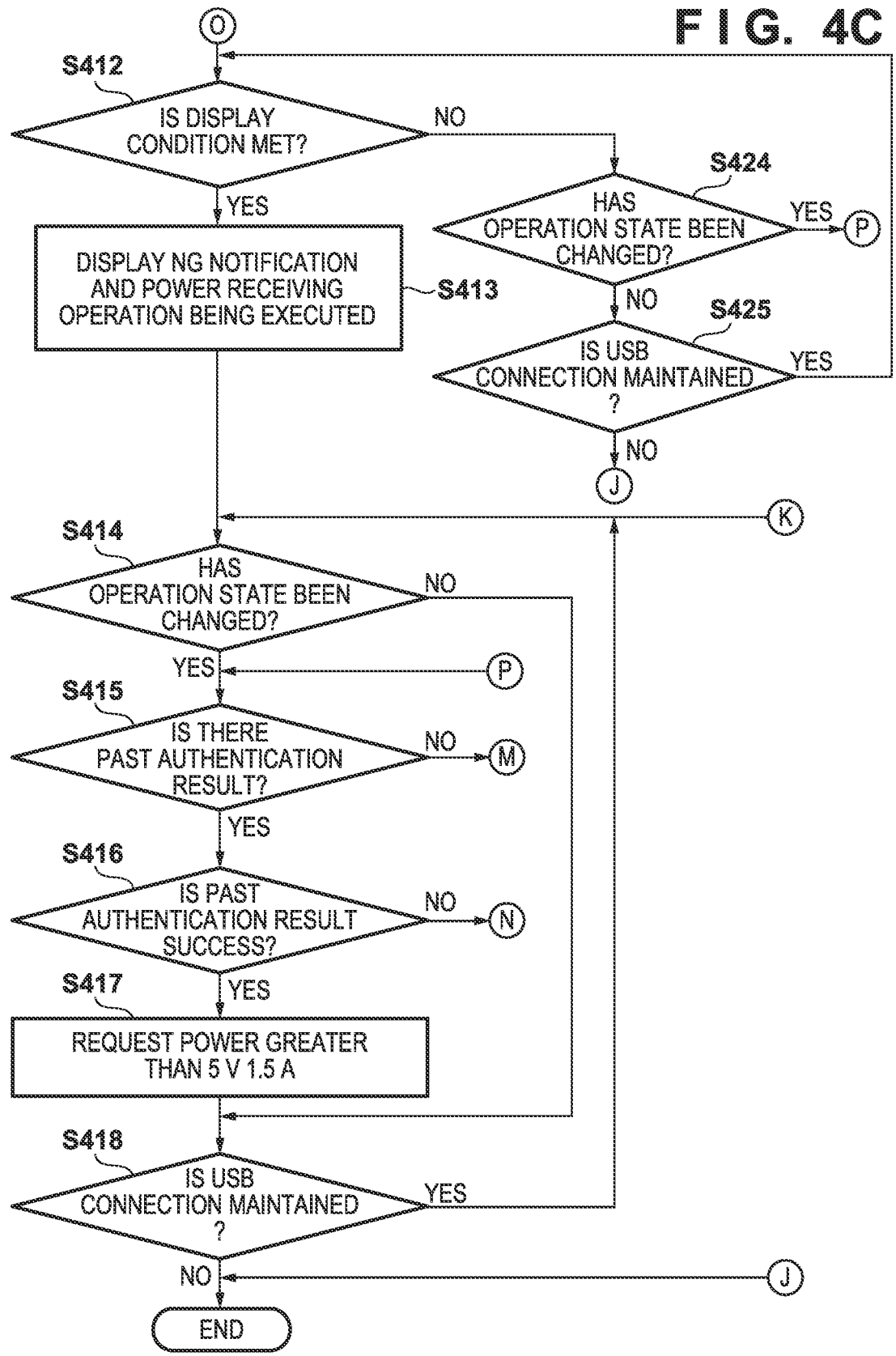

POWER RECEIVING APPARATUS AND CONTROL METHOD

BACKGROUND

Field of the Disclosure

Aspects of the disclosure generally relate to a power receiving apparatus and a method for controlling the power receiving apparatus.

Description of the Related Art

With respect to a wired interface for communication to be connected to an electronic apparatus such as a digital camera, there is a technique that enables power to be transmitted as data is being transferred. USB (Universal Serial Bus) standard can be given as a standard that defines such a technique.

Additionally, USB PD (Power Delivery) standard enables a power receiving apparatus to be connected to a power transmitting apparatus, such as a USB host controller or an AC adapter, by a USB cable, and enables the supply of a maximum of 100 W of power from the power transmitting apparatus to the power receiving apparatus. When a power transmitting apparatus and a power receiving apparatus that support the USB PD standard are connected, Power Negotiation communication (negotiation communication) is performed. This communication enables power information to be exchanged between the apparatuses, and enables the power transmitting apparatus to supply power requested by the power receiving apparatus.

Incidentally, it is generally known that there are power transmitting apparatuses and power receiving apparatuses that have USB standard interfaces but do not properly support the USB standard. For apparatuses that do not properly support the USB standard, there is no guarantee that operations, protective functions, or the like relating to the transfer of power comply with the standard. It may therefore not be possible to guarantee safety when transferring a large amount of power using such apparatuses.

The USB PD standard defines Security communication (C-AUTH authentication communication), in which after negotiation communication is complete, a power transmitting apparatus and a power receiving apparatus exchange authentication information with each other to mutually confirm whether or not the apparatuses properly support the USB standard. Accordingly, performing C-AUTH authentication communication makes it possible to improve safety.

Japanese Patent Laid-Open No. 2013-198214 discloses a technique for determining whether or not to transmit power by determining whether or not the supply capability of a power transmitting apparatus exceeds a maximum power reception capability of a power receiving apparatus.

When a power transmitting apparatus and a power receiving apparatus having C-AUTH authentication communication functions are connected to each other, the C-AUTH authentication communication is performed regardless of the magnitude of the power supplied by the power transmitting apparatus. The C-AUTH authentication communication is therefore performed even when a relatively low amount of power is requested by the power receiving apparatus and there are therefore no safety concerns (e.g., when the power receiving apparatus is powered off). As a result, there is a delay before the power receiving apparatus can be controlled to receive a relatively low desired amount of power. The technique of Japanese Patent Laid-Open No. 2013-198214 cannot solve such a problem.

SUMMARY

According to various embodiments, a power receiving apparatus capable of safely receiving power supplied from a power transmitting apparatus is provided.

According to various embodiments, there is provided a power receiving apparatus comprising: a power receiving unit that receives a first power or a second power higher than the first power from a power transmitting apparatus; and a control unit that (i) controls the power receiving unit to receive the first power from the power transmitting apparatus without performing a determination process of determining whether or not the power transmitting apparatus meets a predetermined condition in a case where the power receiving apparatus is in a first operation state, (ii) performs the determination process of determining whether or not the power transmitting apparatus meets the predetermined condition before the power receiving unit receives the second power from the power transmitting apparatus in a case where the power receiving apparatus is in a second operation state, and (iii) controls the power receiving unit to receive the second power from the power transmitting apparatus in a case where the power receiving apparatus is in the second operation state and the power transmitting apparatus meets the predetermined condition.

According to various embodiments, there is provided a method comprising: controlling a power receiving unit of a power receiving apparatus to receive a first power from a power transmitting apparatus without performing a determination process of determining whether or not the power transmitting apparatus meets a predetermined condition, in a case where the power receiving apparatus is in a first operation state; performing the determination process of determining whether or not the power transmitting apparatus meets the predetermined condition before the power receiving unit of the power receiving apparatus receives a second power higher than the first power from the power transmitting apparatus, in a case where the power receiving apparatus is in a second operation state; and controlling the power receiving unit of the power receiving apparatus to receive the second power from the power transmitting apparatus, in a case where the power receiving apparatus is in the second operation state and the power transmitting apparatus meets the predetermined condition.

Further aspects of the disclosure will become apparent from the following description of exemplary embodiments.

BRIEF DESCRIPTION OF THE DRAWINGS

FIG. 4C is a flowchart illustrating the power reception control process according to the second embodiment.

DESCRIPTION OF THE EMBODIMENTS

Figure 1:
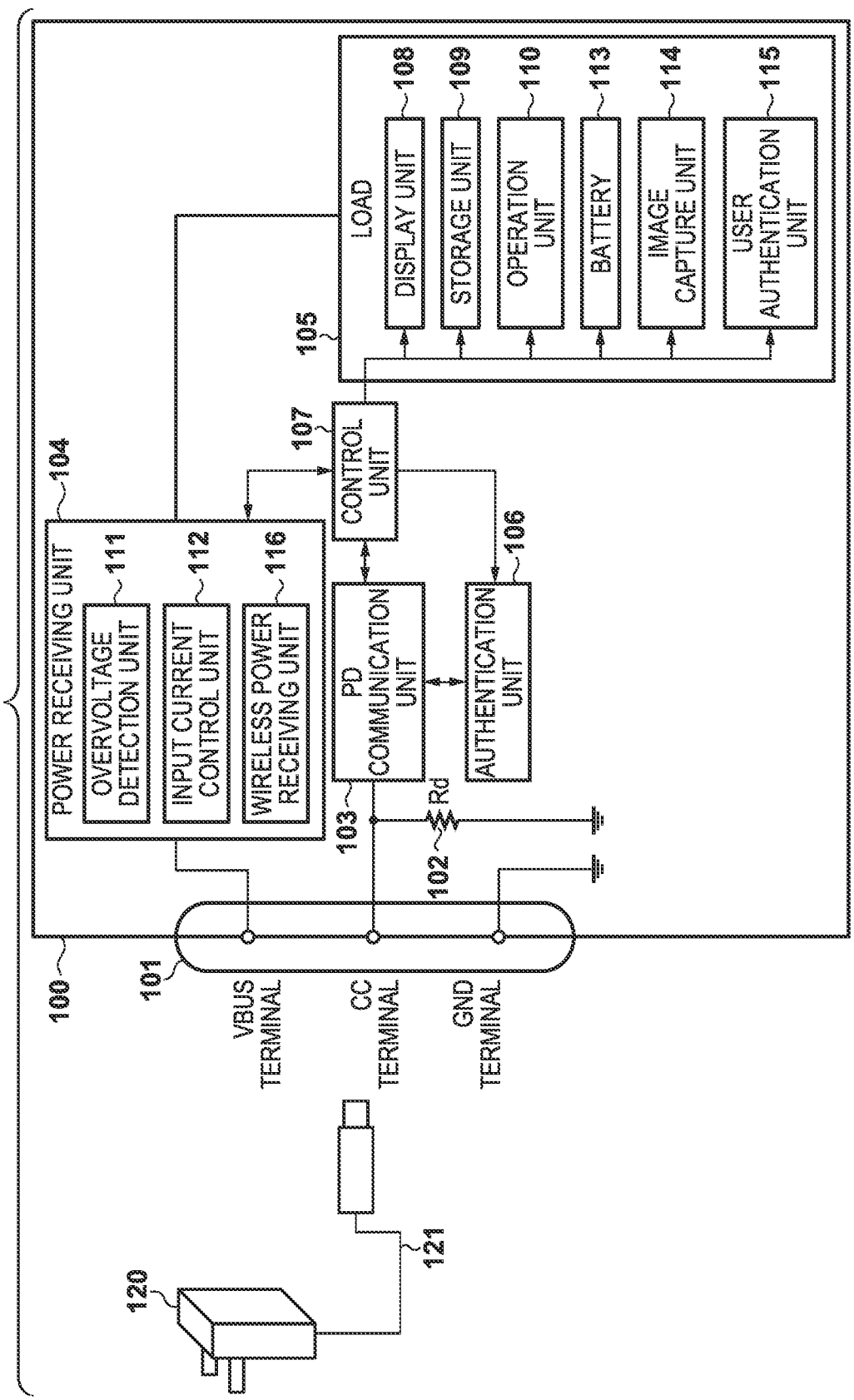
FIG. 1 is a diagram illustrating a system configuration according to a first embodiment.

Exemplary embodiments, features, and aspects of the disclosure will be described below with reference to the drawings. However, aspects of the disclosure are not limited to the following embodiments. In the attached drawings, the same reference numerals are given to the same or similar configurations, and redundant description thereof is omitted.

First Embodiment

FIG. 1 is a diagram illustrating a system configuration according to a first embodiment. In FIG. 1, 120 indicates a power transmitting apparatus. Here, the power transmitting apparatus 120 is illustrated as an AC adapter that uses AC power as a power supply source. However, the power transmitting apparatus 120 is not limited to an AC adapter, and may be, for example, a personal computer (PC) including a USB connector, a portable battery, or the like. 100 indicates a power receiving apparatus that receives power from the power transmitting apparatus 120.

121 indicates a cable for connecting the power transmitting apparatus 120 and the power receiving apparatus 100, and includes USB Type-C plugs on both ends. The cable 121 has a function for transmitting communication data, power, or the like from the power transmitting apparatus 120.

In the power receiving apparatus 100, 101 indicates a connector for receiving power from the power transmitting apparatus 120 (a communication interface capable of receiving power based on a predetermined power transmission standard), and is configured as a USB Type-C receptacle. The connector 101 is defined by the pins illustrated in FIG. 2, and has a VBUS terminal used to supply power, a CC (Configuration Channel) terminal for obtaining information about power supply capabilities of the power transmitting apparatus 120, a GND terminal serving as a signal reference, or the like.

102 indicates a pull-down resistor which is connected between the CC terminal and the GND terminal of the connector 101, and which is defined in USB Type-C standard. The pull-down resistor 102 is used for the power transmitting apparatus 120 to determine a connection with the power receiving apparatus 100, for the power receiving apparatus 100 to determine the power supply capabilities of the power transmitting apparatus 120 by a voltage value, or the like.

107 indicates a control unit that implements various functions of the power receiving apparatus 100 by controlling the operation of a PD communication unit 103, a power receiving unit 104, a load 105, and an authentication unit 106, which will be described later.

103 indicates the PD communication unit which is connected to the CC terminal of the connector 101, performs communication based on the USB PD standard in response to instructions from the control unit 107, determines whether or not the connected power transmitting apparatus 120 supports the USB PD standard, and notifies the control unit 107 of a result of the determination.

When the power transmitting apparatus 120 is capable of performing USB PD communication, the control unit 107 uses the PD communication unit 103 to perform negotiation communication based on a communication protocol defined in the USB PD standard, and requests the power transmitting apparatus 120 to supply a desired power.

106 indicates the authentication unit. The authentication unit 106 performs authentication communication based on the communication protocol defined in the USB PD standard via the PD communication unit 103 in response to instructions from the control unit 107, and authenticates whether or not the power transmitting apparatus 120 is an apparatus which properly supports the USB PD standard. The authentication unit 106 notifies the control unit 107 of a result of the authentication as to whether or not the power transmitting apparatus 120 is an apparatus that properly supports the USB PD standard.

104 indicates the power receiving unit, which is connected to the VBUS terminal of the connector 101 and which supplies power to each component of the power receiving apparatus 100 using power supplied from the power transmitting apparatus 120. The power receiving unit 104 controls the power to be supplied from the power transmitting apparatus 120 in response to instructions from the control unit 107.

111 indicates an overvoltage detection unit within the power receiving unit 104, and monitors a VBUS terminal voltage. When the voltage input from the power transmitting apparatus 120 exceeds a predetermined voltage, the overvoltage detection unit 111 can clip the voltage supplied to the load 105, which is in a later stage, to keep the voltage below the predetermined voltage. In the first embodiment, the predetermined voltage is 5 V.

112 indicates an input current control unit within the power receiving unit 104, which can limit current input from the power transmitting apparatus 120 to less than or equal to a predetermined current. In the first embodiment, the predetermined current is 1.5 A.

Note that the functions of the overvoltage detection unit 111 and the input current control unit 112 can be turned on and off. In the first embodiment, if the power requested of the power transmitting apparatus 120 by the power receiving apparatus 100 is greater than 5 V 1.5 A, the functions are turned off, whereas if the power requested is less than or equal to 5 V 1.5 A, the functions are turned on. Additionally, the overvoltage detection unit 111 notifies the control unit 107 when overvoltage exceeding 5 V is detected. If a notification indicating that overvoltage is detected has been received from the power receiving unit 104, the control unit 107 performs control, via the PD communication unit 103, to stop receiving power from the power transmitting apparatus 120. In this manner, the operation of the control unit 107, the overvoltage detection unit 111, and the input current control unit 112 ensure a set level of safety. However, it is assumed that the power receiving unit 104 is configured having a breakdown voltage of 20 V, and to be capable of receiving power at 20 V 5 A, which is the maximum power within the range of the USB PD standard.

116 indicates a wireless power receiving unit capable of receiving power wirelessly. The wireless power receiving unit 116 can receive power transmitted wirelessly from a wireless power transmitting apparatus and supply the power to the load 105 in a later stage without using the cable 121.

108 is a display unit for displaying an operation state, various setting items, or the like of the power receiving apparatus 100. In the first embodiment, the display unit 108 is also used to display items related to authentication communication by the authentication unit 106. For example, when a result of authentication as to whether or not the power transmitting apparatus 120 properly supports the USB PD standard indicates that the power transmitting apparatus 120 does not properly support the USB PD standard, the display unit 108 is used to notify a user that the authentication has failed. In the following, a case where the authentication result indicates that the power transmitting apparatus 120 does not properly support the USB PD standard will be referred to as the authentication "failing", whereas a case where the authentication result indicates that the power transmitting apparatus 120 properly supports the USB PD standard will be referred to as the authentication "succeeding".

109 indicates a storage unit. The storage unit 109 is constituted by non-volatile memory, and stores programs for causing the power receiving apparatus 100 to operate, various setting items, or the like. In the first embodiment, the storage unit 109 is used to store a program for power receiving operation which executed when the authentication by the authentication unit 106 fails.

110 is an operation unit, constituted by various buttons, switches, or the like, for turning the power of the power receiving apparatus 100 on and off, selecting and accepting various setting items, or the like.

113 is a battery configured to be insertable and removable to and from the power receiving apparatus 100. The battery 113 can be charged by power received from the power transmitting apparatus 120. The power receiving apparatus 100 can operate not only on power received from the power transmitting apparatus 120, but also by supplying power from the charged battery 113 to the various modules.

114 indicates an image capture unit capable of capturing an image of a subject. The image capture unit 114 is constituted by an imaging lens that zooms and focuses a subject image, an image sensor that converts the subject image into electrical image information, or the like.

115 indicates a user authentication unit capable of authenticating the user of the power receiving apparatus 100. The user registers authentication information such as a personal identification number, a fingerprint, their face, or the like in the power receiving apparatus 100 in advance. The power receiving apparatus 100 requests the authentication information to be input upon being powered on, returning from a sleep state, or the like. The power receiving apparatus 100 implements the user authentication by limiting functions unless the correct authentication information is obtained.

105 indicates the load, which is constituted by various types of modules and which operates by consuming power from the power receiving unit 104. The power consumed by the load 105 varies depending on the operation state of the power receiving apparatus 100. Additionally, modules included in the load differ depending on the apparatus type of the power receiving apparatus 100. The first embodiment assumes that the power receiving apparatus 100 is a digital camera. In the first embodiment, the various modules constituting the load 105 include the display unit 108, the storage unit 109, the operation unit 110, the battery 113, the image capture unit 114, and the user authentication unit 115.

FIGS. 3A to 3D are flowcharts illustrating a power reception control process according to the first embodiment. Unless otherwise noted, the power reception control process illustrated in the flowcharts in FIGS. 3A to 3D is performed under the control of the control unit 107.

In step S301, the control unit 107 determines whether or not the power transmitting apparatus 120 has been detected as being connected to the connector 101 by the cable 121. If a connection is detected, the power reception control process proceeds to step S302. If no connection is detected, the control unit 107 repeats the determination of step S301.

In step S302, the power receiving unit 104 receives power from the power transmitting apparatus 120 at a VBUS voltage of 5 V. When connected, the power transmitting apparatus 120 first supplies 5 V in accordance with the USB PD standard, but even if the power transmitting apparatus 120 does not support the USB PD standard, 5 V conforming to the USB standard is still supplied. Here, depending on the power transmitting apparatus 120, the power transmitting apparatus 120 may ignore the voltage conforming to the USB standard and attempt to supply a voltage higher than 5 V. However, in this case, the above-described overvoltage detection unit 111 performs control so that a voltage higher than 5 V is not input from the power receiving unit 104 to the load 105 in a later stage, which ensures a set level of safety with respect to the power receiving apparatus 100.

In step S303, the control unit 107 controls the PD communication unit 103 to start exchanging information with the power transmitting apparatus 120 based on the communication protocol of the USB PD standard.

In step S304, the control unit 107 determines, via the PD communication unit 103, whether or not the power transmitting apparatus 120 supports the USB PD standard. Here, the PD communication unit 103 determines whether or not the connected power transmitting apparatus 120 supports the PD standard according to whether or not predetermined information based on the communication protocol of the USB PD standard has been received from the power transmitting apparatus 120, and notifies the control unit 107 of a result of the determination. The PD communication unit 103 determines that the connected power transmitting apparatus 120 does not support the USB PD standard when the predetermined information based on the communication protocol of the USB PD standard cannot be correctly received, or when the predetermined information cannot be received within a predetermined period.

Here, the "predetermined information" is power information indicating the power that can be supplied by the connected power transmitting apparatus 120. In the first embodiment, as an example, power information indicating that the power transmitting apparatus 120 is capable of supplying 0.5 W (5 V 100 mA), 7.5 W (5 V 1.5 A), and 27 W (9 V 3 A) of power, respectively, is received. The predetermined period may be a period defined in the USB PD standard, e.g., 310 ms.

If it is determined that the power transmitting apparatus 120 supports the USB PD standard, the power reception control process proceeds to step S305. If it is determined that the power transmitting apparatus 120 does not support the USB PD standard, the power reception control process proceeds to step S321.

The case where it is determined that the power transmitting apparatus 120 does not support the USB PD standard will be described first. In step S321, the PD communication unit 103 stops the communication process. The process of step S321 being performed means that it has been determined, in step S304, that the power transmitting apparatus 120 does not support the USB PD standard. As such, the authentication communication by the PD communication unit or the like is not performed, and the power reception control process illustrated in the flowchart of FIGS. 3A to 3D ends.

The case where it is determined that the power transmitting apparatus 120 supports the USB PD standard will be described next. In step S305, the control unit 107 determines whether the operation state of the power receiving apparatus 100 is a first operation state or a second operation state. If the operation state of the power receiving apparatus 100 is the first operation state, the power reception control process proceeds to step S322, whereas if the operation state of the power receiving apparatus 100 is the second operation state, the power reception control process proceeds to step S306.

Here, the "first operation state" is an operation state in which power exceeding a predetermined power is not required to be received from the power transmitting apparatus 120, and the "second operation state" is an operation state in which power exceeding the predetermined power is required to be received from the power transmitting apparatus 120. The magnitude of the predetermined power is determined in such a manner that a set level of safety is maintained even if the authentication of the power transmitting apparatus 120 is omitted, as long as the power from the power transmitting apparatus 120 does not exceed the predetermined power. The predetermined power is assumed to be 5 V 1.5 A (7.5 W) in the following descriptions.

Power off/power on can be given as examples of the first operation state/second operation state. When the power is off, the power consumption is low, and thus the power receiving apparatus 100 requests a power that does not exceed the predetermined power (e.g., 5 V 1.5 A (7.5 W)). When the power is on, the power consumption is high, and thus the power receiving apparatus 100 requests a power that exceeds the predetermined power (e.g., 9 V 3 A (27 W)). A power saving mode/normal mode, a playback mode/shooting mode, screen locked/screen unlocked, when the voltage of the battery 113 is less than a minimum startup voltage of the power receiving apparatus 100/when the voltage of the battery 113 is greater than or equal to the minimum startup voltage of the power receiving apparatus 100, or the like can be given as other examples of the first operation state/second operation state. Charging/supplying power (including supplying power+charging), trickle charging/CC charging, receiving power by the wireless power receiving unit 116/power receiving by the wireless power receiving unit 116 stopped, or the like can be given as further examples. These examples will be described in detail later.

Note that the power requested of the power transmitting apparatus 120 by the power receiving apparatus 100 is greater in the second operation state than in the first operation state, but the power consumed by the power receiving apparatus 100 is not necessarily greater in the second operation state than in the first operation state. For example, consider a case where the first operation state/second operation state correspond to receiving power by the wireless power receiving unit 116/power receiving by the wireless power receiving unit 116 stopped. In this case, in the first operation state, the power receiving apparatus 100 receives power from a wireless power transmitting apparatus in addition to the power transmitting apparatus 120. Therefore, depending on the magnitude of the power that can be received from the wireless power transmitting apparatus, the total power that can be received in the first operation state may be greater than the power that can be received in the second operation state. In such a case, the power consumed by the power receiving apparatus 100 in the first operation state may be greater than the power consumed by the power receiving apparatus 100 in the second operation state.

A case where the operation state of the power receiving apparatus 100 is the first operation state will be described next. In step S322, through the PD communication unit 103, the control unit 107 exchanges information based on the communication protocol of the USB PD standard, and requests the power transmitting apparatus 120 to supply power at 5 V 1.5 A. Because the determination made in step S305 indicates that the operation state of the power receiving apparatus 100 is the first operation state and power exceeding the predetermined power does not need to be received from the power transmitting apparatus 120, a relatively low power that does not exceed the predetermined power, e.g., 5 V 1.5 A, is requested in step S322. Additionally, the authentication communication by the authentication unit 106 (the process of step S306, described later) is not performed, and the power reception control process proceeds to step S316.

After the power reception control process has proceeded from step S322 to step S316, no special process is performed, and 5 V 1.5 A of power continues to be supplied, as long as the operation state does not change, the connection with the power transmitting apparatus 120 is not cut off, or the like. As such, in the first operation state, in which a relatively low power is requested, the power receiving apparatus 100 can perform control for skipping the authentication and quickly requesting the desired power (the control for requesting 5 V 1.5 A in step S322).

Note that the power received through the process of step S322 (third power) may be equal to, greater than, or less than the power received through the process of step S302 (first power) as long as it does not exceed the predetermined power.

Although the power receiving apparatus 100 receives power supplied from the power transmitting apparatus 120 without the authentication unit 106 performing the authentication communication, a set level of safety is ensured by the overvoltage detection unit 111 and the input current control unit 112 described before. In addition to this, according to the standard, when the power transmitting apparatus 120 is connected to the power receiving apparatus 100, 5 V is supplied first, but when the power receiving apparatus 100 receives power without the authentication unit 106 performing the authentication communication, the power receiving apparatus 100 does not change the VBUS voltage from the voltage value of 5 V supplied at the time of the connection. A situation in which a voltage significantly higher than the voltage requested by the power receiving apparatus 100 is supplied to the power transmitting apparatus 120 is therefore unlikely to arise.

A case where the operation state of the power receiving apparatus 100 is the second operation state will be described next. In step S306, the control unit 107 controls the authentication unit 106 to authenticate the power transmitting apparatus 120. Under the control of the control unit 107, the authentication unit 106 exchanges information via the PD communication unit 103 based on the communication protocol of the USB PD standard, and requests the power transmitting apparatus 120 to authenticate whether or not the apparatus properly supports the USB PD standard. The determination made in step S305 indicates that the operation state of the power receiving apparatus 100 is the second operation state and power exceeding the predetermined power is required from the power transmitting apparatus 120. Accordingly, in step S306, under the control of the control unit 107, the authentication unit 106 performs the authentication communication at a stage prior to receiving the large amount of power. Under the control of the control unit 107, the authentication unit 106 determines whether or not the power transmitting apparatus 120 is an apparatus that properly supports the USB PD standard.

Here, the authentication unit 106 determines whether or not the connected power transmitting apparatus 120 is an apparatus that properly supports the USB PD standard in accordance with whether or not predetermined authentication information based on the communication protocol of the USB PD standard has been received from the power transmitting apparatus 120. The authentication unit 106 determines that the connected power transmitting apparatus 120 is not an apparatus that properly supports the USB PD standard when the predetermined authentication information based on the communication protocol of the USB PD standard has not been properly received or the authentication information could not be received within a predetermined period. The predetermined period may be a period defined in the USB PD standard, e.g., 4.5 s.

Note that the process of step S306 is performed to determine whether or not the power transmitting apparatus meets a predetermined condition relating to safety of power transmission (a safety condition). Accordingly, the process performed in step S306 is not limited to the specific process described above, and may be any process that fulfills the role of confirming the safety. The safety condition is not particularly limited, and can be selected as appropriate according to the type of standard used for power transmission (the power transmission standard), a required safety level, or the like. For example, the safety condition may be the condition that the authenticity is confirmed through C-AUTH authentication and that a USB-IF (USB Implementers Forum) compliance test is passed. In this case, in step S306, the control unit 107 performs control to determine the authenticity of the power transmitting apparatus 120 through C-AUTH authentication, and furthermore performs control to determine whether or not the power transmitting apparatus 120 has passed the compliance test (a predetermined power transmission standard compliance test). Although the determination method relating to the compliance test is not particularly limited, for example, the determination can be performed by searching for the identification information (XID) of the power transmitting apparatus 120 obtained in the process of the C-AUTH authentication from a list of XIDs of compliant products provided by the USB-IF.

Next, in step S307, the control unit 107 writes an authentication result (authentication successful or authentication failure) in the storage unit 109. The authentication result (determination result information) stored in the storage unit 109 is referenced and used in steps S317 and S318 when a change in the operation state of the power receiving apparatus 100 is detected in step S316, step S324, step S326, or step S335, which will be described later.

In step S308, the control unit 107 determines whether or not the authentication of the power transmitting apparatus 120 has succeeded in step S306. The power reception control process proceeds to step S309 if the authentication has failed. The power reception control process proceeds to step S323 if the authentication has succeeded.

A case where the authentication of the power transmitting apparatus 120 has succeeded will be described first. In step S323, through the PD communication unit 103, the control unit 107 exchanges information based on the communication protocol of the USB PD standard, and requests the power transmitting apparatus 120 to supply a power greater than 5 V 1.5 A, e.g., the maximum power that the power transmitting apparatus 120 is capable of supplying. Assume that a power of 9 V 3 A is requested here, as described earlier. The authentication of the power transmitting apparatus 120 has succeeded in step S308, which guarantees that the power transmitting apparatus 120 properly supports the USB PD standard (meets the safety condition). Therefore, the user can safely use the power transmitting apparatus 120 and the power receiving apparatus 100 even if the requested power is high. After the requested power has been received by the power receiving unit 104, the power reception control process proceeds to step S316.

After the power reception control process has proceeded from step S323 to step S316, no special process is performed, and a power greater than 5 V 1.5 A (9 V 3 A) continues to be supplied, as long as the operation state does not change, the connection with the power transmitting apparatus 120 is not cut off, or the like.

A case where the authentication of the power transmitting apparatus 120 has failed will be described next. In step S309, through the PD communication unit 103, the control unit 107 exchanges information based on the communication protocol of the USB PD standard, and requests a pre-set power (e.g., 5 V 1.5 A) from the power transmitting apparatus 120. According to the determination in step S305, the power required is high because the operation state of the power receiving apparatus 100 is the second operation state, but because the authentication has failed in step S308, it is desirable that the user select what kind of power should be received. Therefore, the power receiving apparatus 100 requests a low power (not exceeding the predetermined power, e.g., 5 V 1.5 A) that ensures a set level of safety until a selection is made by the user in the processes following step S310. After the requested power has been received by the power receiving unit 104, the power reception control process proceeds to step S310.

In step S310, the control unit 107 determines whether or not a predetermined display condition for displaying information relating to the authentication failure in the display unit 108 is met. If authentication by the authentication unit 106 has failed, it is necessary to notify the user of the information relating to the authentication failure, and there are multiple examples of the predetermined display condition with respect to the display unit 108 making that display. Examples of the predetermined display condition include that authentication has failed, the voltage of the battery 113 is greater than the minimum startup voltage for starting up the power receiving apparatus 100, the operation unit 110 is operated for the first time after authentication has failed.

First, for the condition that authentication has failed, the display unit 108 makes the display at the time of the authentication failure, which has the effect of notifying the user of information relating to the authentication failure as soon as possible.

Next, the condition that the voltage of the battery 113 is greater than the minimum startup voltage for starting up the power receiving apparatus 100 will be described, assuming a case where the battery 113 is charged using the power received from the power receiving unit 104. For example, when charging the battery 113 from a state where there is no remaining power, charging with a small current (called "trickle charging") is performed for safety reasons in the initial stage of charging, and it therefore takes several minutes for the voltage of the battery 113 to exceed the minimum startup voltage. When the power transmitting apparatus 120 supplies a limited power, it is necessary to use the power of the battery 113 to start up the power receiving apparatus 100 and make a display in the display unit 108. On the other hand, the power receiving apparatus 100 cannot be started up using the battery 113 until the voltage of the battery 113 exceeds the minimum startup voltage as a result of the charging, and thus no display can be made in the display unit 108. Therefore, when recharging the battery 113 with power supplied from the power transmitting apparatus 120, from a state in which there is no power remaining in the battery 113, there is a time lag of several minutes from when the user connects the power transmitting apparatus 120 and the power receiving apparatus 100 to when the display can be made in the display unit 108. Accordingly, when the condition that the voltage of the battery 113 is greater than the minimum startup voltage for starting up the power receiving apparatus 100 is met, the display unit 108 displays the information relating to the authentication failure.

The condition that the operation unit 110 is operated for the first time after authentication has failed will be described last. As described above, when recharging the battery 113 with power supplied from the power transmitting apparatus 120, from a state in which there is no power remaining in the battery 113, there is a time lag of several minutes from when the user connects the power transmitting apparatus 120 and the power receiving apparatus 100 to when the display can be made in the display unit 108. When there is such time lag, after connecting the power transmitting apparatus 120 and the power receiving apparatus 100 and starting the charging of the battery 113, the user may step away from the power receiving apparatus 100 before the information relating to the authentication failure is displayed in the display unit 108. In a situation where the user is not looking at the display unit 108, displaying the information relating to the authentication failure will have no effect, but continuing to display the information in the display unit 108 for a long period of time is problematic in that doing so causes screen burn-in. Accordingly, when it can be determined that the user is in a location where they can see the power receiving apparatus 100, e.g., when the user operates the operation unit 110, the display unit 108 displays the information relating to the authentication failure. Setting the predetermined display condition in this manner is expected to provide an effect of suppressing burn-in caused by long displays in the display unit 108.

The power reception control process proceeds to step S311 when the predetermined display condition is met, and proceeds to step S324 when the predetermined display condition is not met.

A case where the predetermined display condition is not met will be described first. In step S324, the control unit 107 determines whether or not the operation state of the power receiving apparatus 100 has been changed from the second operation state to the first operation state. The power reception control process proceeds to step S317 if the operation state has been changed. The power reception control process proceeds to step S325 if the operation state has not been changed.

In step S325, the control unit 107 determines whether or not the power transmitting apparatus 120 has been connected to the connector 101 by the cable 121. If the apparatus has been connected, the power reception control process proceeds to step S310. If the apparatus has not been connected, the connection with the power transmitting apparatus 120 has been cut off, and thus the power reception control process illustrated in the flowcharts in FIGS. 3A to 3D ends.

The control unit 107 enters a standby state when a determination of NO is made in step S310, a determination of NO is made in step S324, and a determination of YES is made in step S325. The standby state is canceled when the predetermined display condition of the display unit 108 is met, the operation state of the power receiving apparatus 100 is changed, or the connection with the power transmitting apparatus 120 is cut off. Note that a case where the operation state is changed and the power reception control process proceeds to step S317 will be described in detail later.

A case where the predetermined display condition is met will be described next. In step S311, the display unit 108 displays an indication that the power receiving apparatus 100 has failed to authenticate the power transmitting apparatus 120, as well as options for power receiving operations, as the information relating to the authentication failure.

As described earlier, when the operation state of the power receiving apparatus 100 is the second operation state and the requested power is high, but the authentication has failed, it is desirable for the user to select what power should be received. Accordingly, the information displayed by the display unit 108 is information indicating that the authentication of the power transmitting apparatus 120 has failed (a failure notification), options relating to the power receiving operation which the power receiving apparatus 100 can perform from now on, and a prompt for the user to make a selection. The user can operate the power receiving apparatus 100 through the operation unit 110 and select their preferred power receiving operation.

Figure 5:
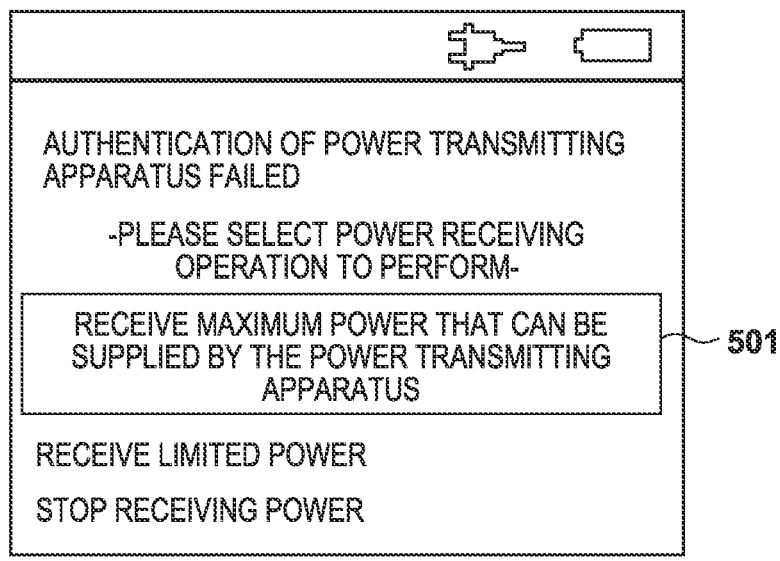
FIG. 5 is a diagram illustrating an example of a screen displayed in step S311.

FIG. 5 is a diagram illustrating an example of a screen displayed in step S311. The screen illustrated in FIG. 5 serves as a selection screen prompting the user to select one of the power receiving operations. As illustrated in FIG. 5, "receive the maximum power that can be supplied by the power transmitting apparatus", "receive limited power", and "stop receiving power" can be given as examples of the options for the power receiving operations. The "limited power" referred to here is power that does not exceed the predetermined power. For example, by using a directional key included in the operation unit 110, the user can move a cursor 501 to the position of a desired option and press an "OK" button included in the operation unit 110 to select one of the power receiving operations.

Even if the power transmitting apparatus 120 does not properly support the USB PD standard, some users may wish to use the power transmitting apparatus 120 without setting a limit on the power received, for purposes such as utilizing the maximum performance of the power transmitting apparatus 120 and maximizing the charging speed of the battery 113. An option for such users is "receive the maximum power the power transmitting apparatus can supply". However, as mentioned earlier in the description of the power receiving unit 104, the breakdown voltage of the power receiving unit 104 is 20 V. In the scope of the USB PD standard, the maximum power is 20 V 5 A, but a situation is conceivable in which the power transmitting apparatus 120 does not properly support the USB PD standard and a voltage exceeding 20 V is input. Therefore, in the power receiving operation of "receive the maximum power the power transmitting apparatus can supply", the control unit 107 calculates the maximum power within a range of the breakdown voltage of the power receiving unit 104, e.g., less than or equal to 20 V, and sets that power as the requested power.

As mentioned above, in the first embodiment, a set level of safety is ensured for receiving a power of 5 V 1.5 A. An option for users who wish to use the power transmitting apparatus 120 while ensuring the set level of safety is "receive limited power".

There are also users who wish to stop use for safety reasons if the power transmitting apparatus 120 does not properly support the USB PD standard. An option for such users is "stop receiving power".

In step S312, the control unit 107 determines whether or not a power receiving operation has been selected in the screen displayed in the display unit 108 in step S311. If a power receiving operation has been selected, the power reception control process proceeds to step S313. If a power receiving operation has not been selected, the power reception control process proceeds to step S326.

A case where a power receiving operation has not been selected will be described first. The processes of steps S326 and S327 are similar to the processes of steps S324 and S325 described above. However, when it is determined in step S327 that the power transmitting apparatus 120 is connected, the power reception control process proceeds to step S312.

The control unit 107 enters a standby state when a determination of NO is made in step S312, a determination of NO is made in step S326, and a determination of YES is made in step S327. The standby state is canceled when a power receiving operation is selected, the operation state of the power receiving apparatus 100 changes, or the connection with the power transmitting apparatus 120 is cut off. Note that a case where the operation state is changed and the power reception control process proceeds to step S317 will be described in detail later.

A case where a power receiving operation has been selected will be described next. In step S313, the control unit 107 writes a selection result (selection result information indicating the power receiving operation selected in step S312) into the storage unit 109. The selection result stored in the storage unit 109 is referenced and used in steps S330 and S331 when a past authentication result is determined to be an authentication failure in step S318, which will be described below.

In step S314, the control unit 107 determines whether or not the power receiving operation selected in step S312 is "receive the maximum power the power transmitting apparatus can supply". If the selected power receiving operation is "receive the maximum power the power transmitting apparatus can supply," the power reception control process proceeds to step S315, and if not, the power reception control process proceeds to step S328.

In step S328, the control unit 107 determines whether or not the power receiving operation selected in step S312 is "receive limited power". If the selected power receiving operation is "receive limited power", the power reception control process proceeds to step S329, and if not (e.g., if the selected power receiving operation is "stop receiving power"), the power reception control process proceeds to step S334.

In step S315, through the PD communication unit 103, the control unit 107 exchanges information based on the communication protocol of the USB PD standard, and requests the power transmitting apparatus 120 to supply the maximum power that the power transmitting apparatus 120 is capable of supplying. The determination in step S314 indicates that the user desires the maximum power the power transmitting apparatus 120 is capable of supplying to be supplied (e.g., that no limit be placed on the received power). Accordingly, the control unit 107 identifies the maximum power the power transmitting apparatus 120 is capable of supplying based on the power information indicating the power that the power transmitting apparatus 120 is capable of supplying, obtained in step S304. For example, when there are three types of power that can be supplied by the power transmitting apparatus 120, namely 5 V 100 mA, 5 V 1.5 A, and 9 V 3 A, the control unit 107 sets the power of 9 V 3 A, which is the largest thereof, as the requested power. However, as mentioned earlier in the descriptions of the power receiving operation options in step S311, it is assumed that the control unit 107 requests the maximum power within a range less than or equal to the 20 V breakdown voltage of the power receiving unit 104. After the requested power has been received by the power receiving unit 104, the power reception control process proceeds to step S316.

After the power reception control process has proceeded from step S315 to step S316, no special process is performed, and the maximum power that the power transmitting apparatus 120 is capable of supplying (9 V 3 A) continues to be supplied, as long as the operation state does not change, the connection with the power transmitting apparatus 120 is not cut off, or the like.

In step S329, through the PD communication unit 103, the control unit 107 exchanges information based on the communication protocol of the USB PD standard, and requests limited power from the power transmitting apparatus 120.

The determination in step S328 indicates that the user desires to use the power receiving apparatus 100 while ensuring a set level of safety. As a specific example of the limited power (power not exceeding the predetermined power), the power receiving apparatus 100 requests 5 V 1.5 A. This enables the user to use the power receiving apparatus 100 while ensuring a set level of safety as mentioned earlier. After the requested power has been received by the power receiving unit 104, the power reception control process proceeds to step S316.

After the power reception control process has proceeded from step S329 to step S316, no special process is performed, and the limited power (5 V 1.5 A) continues to be supplied, as long as the operation state does not change, the connection with the power transmitting apparatus 120 is not cut off, or the like.

Note that the power received through the process of step S329 (fourth power) may be equal to, greater than, or less than the power received through the process of step S302 (the first power) as long as it does not exceed the predetermined power.

Additionally, if the limited power requested in step S329 is equal to the power requested in step S309, as in the above-described example, the control unit 107 may continue to receive the power requested in step S309 without making an explicit request in step S329.

In step S334, through the PD communication unit 103, the control unit 107 exchanges information based on the communication protocol of the USB PD standard, and requests the power transmitting apparatus 120 to stop the supply of power. The determination in step S328 indicates that the user wishes to stop the power reception. Accordingly, the power receiving apparatus 100 requests the power transmitting apparatus 120 to stop the supply of power. Additionally, the power receiving unit 104 performs control for cutting off the supply path through which power can be supplied to the load 105 via the VBUS terminal, and stopping the supply of power from the power transmitting apparatus 120 to the load 105. Through this, even if the power transmitting apparatus 120 does not respond to the request from the power receiving apparatus 100 to stop the supply of power, and continues to supply power, the power supply path to the load 105 is cut off, which makes it possible to ensure safety. The power reception control process illustrated in the flowchart of FIGS. 3A to 3D then ends.

The processes of steps S314, S315, S328, S329, and S334 enables the power receiving operation selected in step S312 to be implemented.

The processes from step S316 and on will be described next. In step S316, the control unit 107 determines whether or not the operation state of the power receiving apparatus 100 has been changed. Here, a change from the second operation state to the first operation state or a change from the first operation state to the second operation state may be detected. The power reception control process proceeds to step S317 if the operation state has been changed. The power reception control process proceeds to step S320 if the operation state has not been changed.

In step S317, the control unit 107 refers to the storage unit 109, and determines whether or not a past authentication result is stored. If an authentication result is stored, the power reception control process proceeds to step S318, whereas if an authentication result is not stored, the power reception control process proceeds to step S306.

If an authentication result is stored, the power receiving apparatus 100 can enter the second operation state and perform authentication at least once while the connection with the power transmitting apparatus 120 is maintained. Accordingly, if the control unit 107 references the stored authentication result, there is no need for the authentication unit 106 to perform the authentication again. On the other hand, the authentication result not being stored means that the power receiving apparatus 100 has changed to the second operation state, in which a large amount of power is required, for the first time since connecting to the power transmitting apparatus 120, and thus the authentication communication in the aforementioned step S306 is performed.

Note that when the connection with the power transmitting apparatus 120 has been cut off, it is unknown whether the power transmitting apparatus 120 connected next is the same as the previous power transmitting apparatus 120. It is therefore necessary for the authentication unit 106 to perform the authentication again. Accordingly, the control unit 107 deletes the authentication result stored in the storage unit 109 when the connection with the power transmitting apparatus 120 is cut off. Therefore, skipping the authentication by referencing a past authentication result only has an effect when the connection with the power transmitting apparatus 120 is maintained.

In step S318, the control unit 107 determines whether or not the past authentication result stored in the storage unit 109 is "authentication success". If the result is "authentication success", the power reception control process proceeds to step S319. If the result is "authentication failure", the power reception control process proceeds to step S330.

A case where the past authentication result is "authentication success" will be described first. In step S319, through the PD communication unit 103, the control unit 107 exchanges information based on the communication protocol of the USB PD standard, and requests the power transmitting apparatus 120 to supply a power greater than 5 V 1.5 A (e.g., the maximum power that the power transmitting apparatus 120 is capable of supplying). The determination of step S318 indicates that the authentication unit 106 has successfully authenticated the power transmitting apparatus 120 in the past. Accordingly, the user can use the power transmitting apparatus 120 and the power receiving apparatus 100 safely even if the power receiving apparatus 100 receives the maximum power that can be supplied by the power transmitting apparatus 120. In step S319, the operation state of the power receiving apparatus 100 may be the first operation state or the second operation state, but in either case, the operation state enters the second operation state, and the authentication is performed, at least once while the connection with the power transmitting apparatus 120 is maintained. Accordingly, even in the first operation state, the control unit 107 may request a power greater than 5 V 1.5 A. After the requested power has been received by the power receiving unit 104, the power reception control process proceeds to step S320.

A case where the past authentication result is "authentication failure" will be described next. In step S330, the control unit 107 refers to the storage unit 109, and for the power receiving operation options, determines whether or not a past selection result is stored. If a past selection result is stored, the power reception control process proceeds to step S331, whereas if a past selection result is not stored, the power reception control process proceeds to step S310.

A selection result being stored means that an option desired by the user has been selected in the past as a power receiving operation for the power transmitting apparatus 120 that has failed the authentication. Accordingly, if the control unit 107 references the past selection result, there is no need for the display unit 108 to display the options again and have the user make a selection. However, no selection result being stored means that the past authentication result was a failure and the user has never selected a power receiving operation. As such, the power reception control process proceeds to step S310, and the display of the options or the like in step S311, which satisfy the display conditions for the display unit 108, is performed. Note that a case where the past authentication result is a failure and no selection result is stored corresponds to a determination of NO in step S310 and YES in step S324. In this case, in the following processes, a determination of YES is made in step S317; NO, in step S318; and NO, in step S330.

Unlike the storage of the authentication result, when a selection result is stored, the selection result may remain stored in the storage unit 109, rather than being deleted by the control unit 107, even after the connection with the power transmitting apparatus 120 is cut off. In this case, if the authentication in step S308 has failed, the control unit 107 references the past selection result stored in the storage unit 109. If there is no stored selection result, the power reception control process proceeds to step S309, whereas if there is a stored selection result, the power reception control process proceeds to step S332.

The reason for holding the selection result even after the connection with the power transmitting apparatus 120 is cut off will be described here. Assuming that a selection result has been stored when making a connection with a first power transmitting apparatus, applying the stored selection result is valid when connecting to that same first power transmitting apparatus. Furthermore, even when a different second power transmitting apparatus has been connected, applying the selection result stored when connecting to the first power transmitting apparatus to determine the power receiving operation is a valid method. This is because the user is more likely to select the same power receiving operation for any power transmitting apparatus that fails authentication than to identify each power transmitting apparatus and select individual power receiving operation. By applying the stored selection result, the control unit 107 can implement the power receiving operation desired by the user while avoiding making a complicated display. There are many cases where the user actually uses the same power transmitting apparatus to receive power, which further increases the probability that the power receiving operation determined from the stored selection result is preferable for the user.

In step S331, the control unit 107 determines the power receiving operation based on the past selection result stored in the storage unit 109. Through the PD communication unit 103, the control unit 107 exchanges information based on the communication protocol of the USB PD standard. Then, in accordance with the power receiving operation selected in the past ("receive the maximum power the power transmitting apparatus can supply", "receive limited power", or "stop receiving power"), the control unit 107 requests the corresponding power, or requests power reception to stop, from the power transmitting apparatus 120. The process of step S331 is the same as the processes described in steps S314, S328, S315, S329, and S334. However, in step S331, after the requested power has been received by the power receiving unit 104, the power reception control process proceeds to step S332.

In step S332, the control unit 107 determines whether or not a predetermined display condition for displaying information relating to the authentication failure in the display unit 108 is met. The predetermined display condition is the same as that described with reference to step S310. If the predetermined display condition is met, the power reception control process proceeds to step S333. If the predetermined display condition is not met, the power reception control process proceeds to step S335.

A case where the predetermined display condition is not met will be described first. The processes of steps S335 and S336 are similar to the processes of steps S324 and S325 described above. However, when it is determined in step S336 that the power transmitting apparatus 120 is connected, the power reception control process proceeds to step S332.

The control unit 107 enters the standby state when a determination of NO is made in step S332, a determination of NO is made in step S335, and a determination of YES is made in step S336. The standby state is canceled when the display condition of the display unit 108 is met, the operation state of the power receiving apparatus 100 is changed, or the connection with the power transmitting apparatus 120 is cut off.

A case where the predetermined display condition is met will be described next. In step S333, the display unit 108 displays an indication that the power receiving apparatus 100 has failed to authenticate the power transmitting apparatus 120, as well as the power receiving operation being performed by the power receiving apparatus 100, as the information relating to the authentication failure.

When the power receiving operation has been determined based on a past selection result, the user may not know which power receiving operation the power receiving apparatus 100 is performing. Accordingly, the information displayed by the display unit 108 is the fact that the power transmitting apparatus 120 has failed the authentication and the power receiving operation performed by the power receiving apparatus 100.

In step S320, the control unit 107 determines whether or not the power transmitting apparatus 120 has been connected to the connector 101 by the cable 121. If the apparatus has been connected, the power reception control process proceeds to step S316. If the apparatus has not been connected, the connection with the power transmitting apparatus 120 has been cut off, and thus the power reception control process illustrated in the flowcharts in FIGS. 3A to 3D ends.

Each of the aforementioned examples of the first operation state/second operation state (power off/power on or the like) will be described in detail here. The aforementioned examples include an example in which a load current aside from charging changes, and an example in which a load current relating to charging changes, between the first operation state and the second operation state.

In the aforementioned example in which the first operation state/second operation state are power off/power on, it is assumed that when the power receiving apparatus 100 is powered off, the power consumption is low and only 5 V 1.5 A is required, whereas when the power receiving apparatus 100 is powered on, the power consumption is high and 9 V 3 A is required. Power saving mode/normal mode, playback mode/shooting mode, and screen locked/screen unlocked are other examples, aside from the example of power off/power on, in which the requested power changes according to the degree of power consumption.

First, consider a case in which a power saving mode that suppresses power consumption by suppressing the brightness of the display of the display unit 108 or the like, and a normal mode in which power consumption is not suppressed, can be set as the operation mode of the power receiving apparatus 100. In this case, the power receiving apparatus 100 may request a power of 5 V 1.5 A in the power saving mode, and a power greater than 5 V 1.5 A in the normal mode. Additionally, consider a case in which the power receiving apparatus 100 has an image capture function, and the display unit 108 has a playback mode in which a shot image is displayed (where no power is supplied to the image capture unit 114) and a shooting mode in which the image capture function is used (where power is supplied to the image capture unit 114). In this case, the power receiving apparatus 100 may request a power of 5 V 1.5 A in the playback mode because the power consumption is low, and a power greater than 5 V 1.5 A in the shooting mode because the power consumption is high.

A configuration is also conceivable in which the display unit 108 displays a lock screen when the power receiving apparatus 100 is started up, and after the lock is unlocked through user authentication, the user can use the functions of the power receiving apparatus 100. A case where the power receiving apparatus 100 is a smartphone can be given as a specific example, and in this case, the first operation state/second operation state may be screen locked/screen unlocked. The power receiving apparatus 100 may request a power of 5 V 1.5 A when the screen is locked (before user authentication succeeds) because the power consumption is low, and may request a power greater than 5 V 1.5 A after the screen is unlocked (after user authentication succeeds) because the power consumption is higher than when the screen is locked.

Note that when the screen being locked is taken as the first operation state and the screen being unlocked is taken as the second operation state, there is a secondary effect when the authentication unit 106 fails to authenticate the power transmitting apparatus 120. In this case, the authentication of the power transmitting apparatus 120 by the authentication unit 106, the display of power receiving operation options in the event of authentication failure, or the like are performed after the screen is unlocked. In other words, the display unit 108 displays the power receiving operation options after the user authentication is complete (successful). This reduces the likelihood of a third party other than an authorized user selecting a power receiving operation related to the power transmitting apparatus 120 that has failed the authentication by the authentication unit 106 and receiving power.

Additionally, as described earlier, when the power transmitting apparatus 120 supplies a limited power, it is necessary to use the power of the battery 113 (the battery used in the operation of the power receiving apparatus 100) to start up the power receiving apparatus 100 and make a display in the display unit 108. Accordingly, the display unit 108 cannot make a display unless the voltage of the battery 113 is greater than the minimum startup voltage for starting at the power receiving apparatus 100. Therefore, the power consumption of the display unit 108 is low when the voltage of the battery 113 is less than the minimum startup voltage, whereas the power consumption of the display unit 108 is high when the voltage of the battery 113 is greater than or equal to the minimum startup voltage. As such, the power receiving apparatus 100 requests a power of 5 V 1.5 A when the voltage of the battery 113 is less than the minimum startup voltage of the power receiving apparatus 100, and requests a power greater than 5 V 1.5 A when the voltage of the battery 113 is greater than or equal to the minimum startup voltage of the power receiving apparatus 100.

Charging/supplying power (including supplying power+charging), trickle charging/CC charging, and receiving power by the wireless power receiving unit 116/power receiving by the wireless power receiving unit 116 stopped can be given as further examples in which the load current relating to charging of the battery 113 changes.

Comparing a case where the power receiving unit 104 supplies the power received from the power transmitting apparatus 120 to the battery 113 only (charging) with a case where the power is supplied to modules of the load 105 aside from the battery 113 (supplying power), the load current may be higher when supplying power than when charging. Additionally, the load current is higher than charging in the case of what is called "supplying power+charging", in which the received power exceeds the power consumed by the modules and the leftover power is used to charge the battery 113. It is therefore conceivable for the power receiving apparatus 100 to request a power of 5 V 1.5 A during charging, and request a power greater than 5 V 1.5 A when supplying power and during supplying power+charging.

Additionally, as described earlier, when charging from a state in which there is no power remaining in the battery 113, trickle charging is performed using a small current in the initial stage of charging for safety reasons. On the other hand, when the power remaining in the battery 113 exceeds a set amount, charging is performed using a constant current greater than that used during trickle charging (called "CC charging"). Accordingly, it is conceivable that the power receiving apparatus 100 will request a power of 5 V 1.5 A during trickle charging, because the charging current is low, and will request a power greater than 5 V 1.5 A during CC charging, because the charging current increases.

Additionally, if the power receiving apparatus 100 can receive power wirelessly and is receiving power wirelessly from a wireless power transmitting apparatus aside from the power transmitting apparatus 120, it may not be necessary to receive a large amount of power from the power transmitting apparatus 120. Accordingly, it is conceivable for the power receiving apparatus 100 to request a power of 5 V 1.5 A when receiving power wirelessly, and request a power greater than 5 V 1.5 A when not receiving power wirelessly. If the power transmitting apparatus 120 is connected while the power receiving apparatus 100 is receiving power wirelessly from the wireless power transmitting apparatus, it is thought that the purpose of the connection is to perform data communication with the power transmitting apparatus 120, not to receive power from the power transmitting apparatus 120.

As described thus far, according to the first embodiment, the power receiving apparatus 100 determines whether the operation state of the power receiving apparatus 100 is the first operation state or the second operation state. The first operation state is an operation state in which it is not necessary to receive power exceeding a predetermined power from the power transmitting apparatus 120, and the second operation state is an operation state in which it is necessary to receive power exceeding the predetermined power from the power transmitting apparatus 120. When the operation state of the power receiving apparatus 100 is determined to be the second operation state, the power receiving apparatus 100 performs a process for determining whether or not the power transmitting apparatus 120 meets a safety condition (e.g., the authentication communication of step S306). When the operation state of the power receiving apparatus 100 is determined to be the first operation state, the power receiving apparatus 100 skips the determination process. Accordingly, when the power required to be received by the power receiving apparatus 100 from the power transmitting apparatus 120 is relatively low, the process for determining whether or not the power transmitting apparatus 120 meets the safety condition can be skipped.

Additionally, when authentication of the power transmitting apparatus 120 has failed, the power receiving apparatus 100 displays options for power receiving operations and prompts the user to make a selection, and thus even users unaware that there are multiple options for the power receiving operations can be made aware of the options for the power receiving operations. Additionally, once a user has selected a power receiving operation option once, from the next time on, the power receiving apparatus 100 receives power using the power receiving operation selected previously without prompting the user to make a selection, which makes it possible to skip the second and subsequent selection operations.

Second Embodiment

A second embodiment differs from the first embodiment in terms of the method for determining the power receiving operation when the authentication of the power transmitting apparatus 120 has failed. In the first embodiment, when the authentication has failed, power receiving operation options are displayed in the display unit 108, and a power receiving operation selected through a user operation. In contrast, and the second embodiment, the power receiving apparatus 100 is configured such that a power receiving operation to be performed in the event that authentication fails can be set in advance through a menu screen. Through this, even if the user does not notice the display in the display unit 108 when the authentication has failed, the power receiving operation which has been set can be applied immediately.

Figure 2:
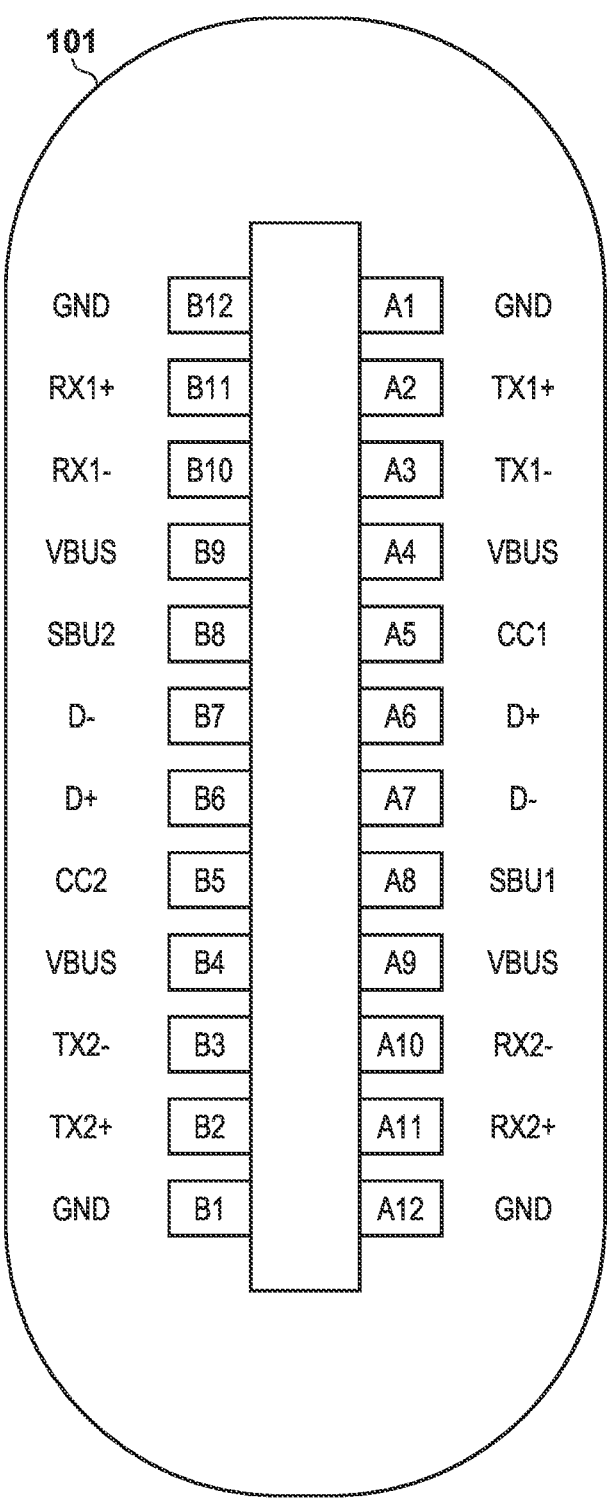
FIG. 2 is a diagram illustrating a pin layout of a connector 101.
Figure 3A:
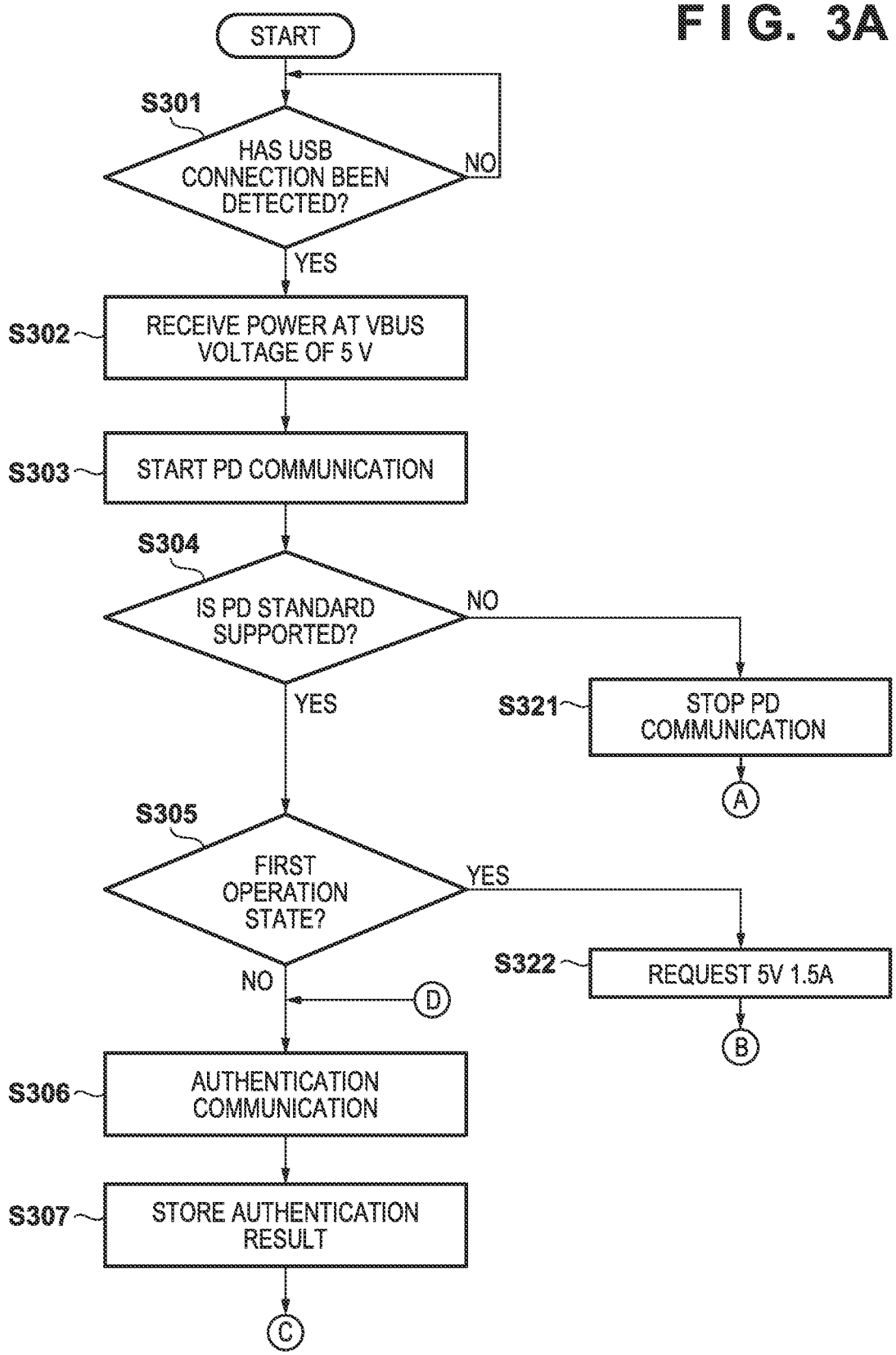
FIG. 3A is a flowchart illustrating a power reception control process according to the first embodiment.
Figure 3B:
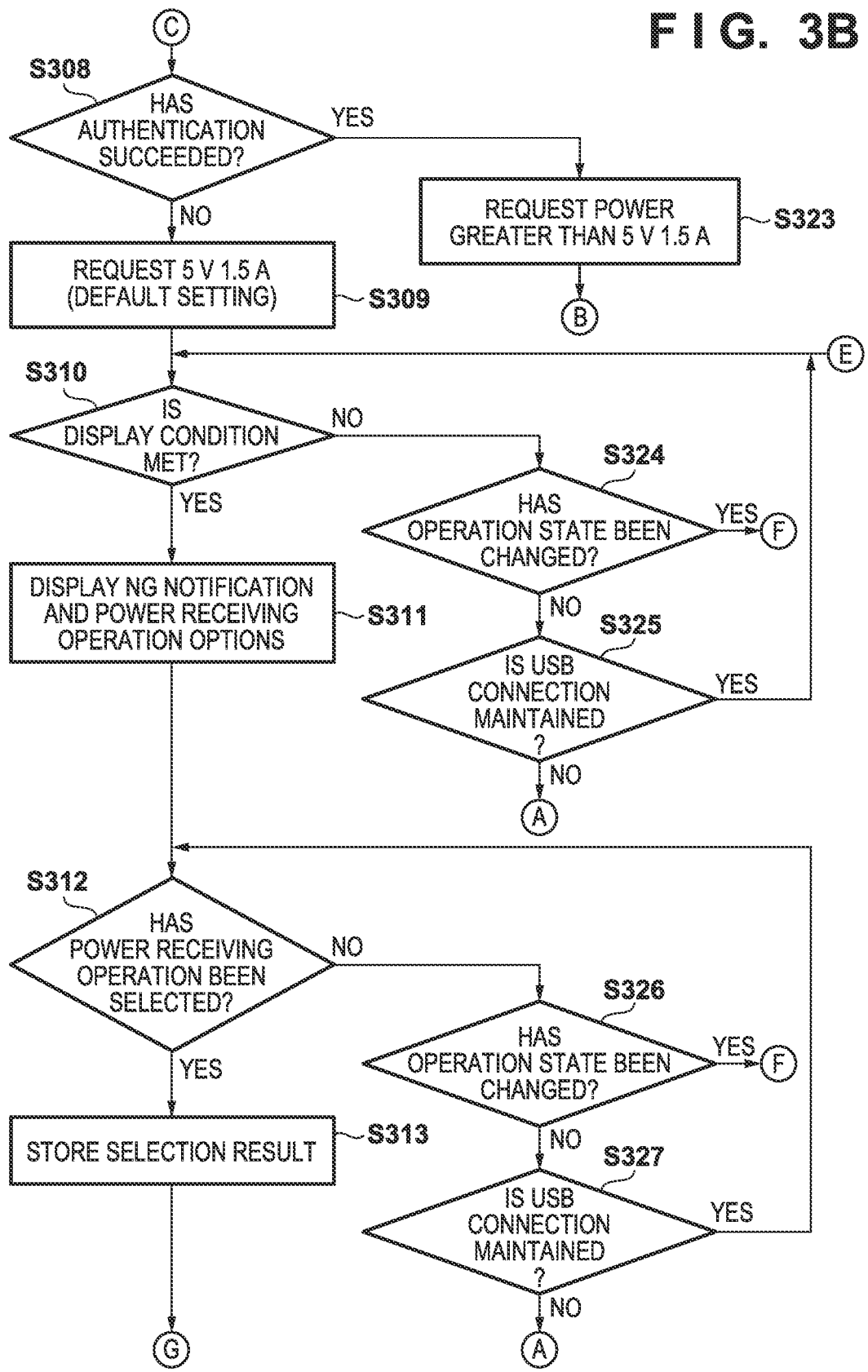
FIG. 3B is a flowchart illustrating the power reception control process according to the first embodiment.
Figure 3C:
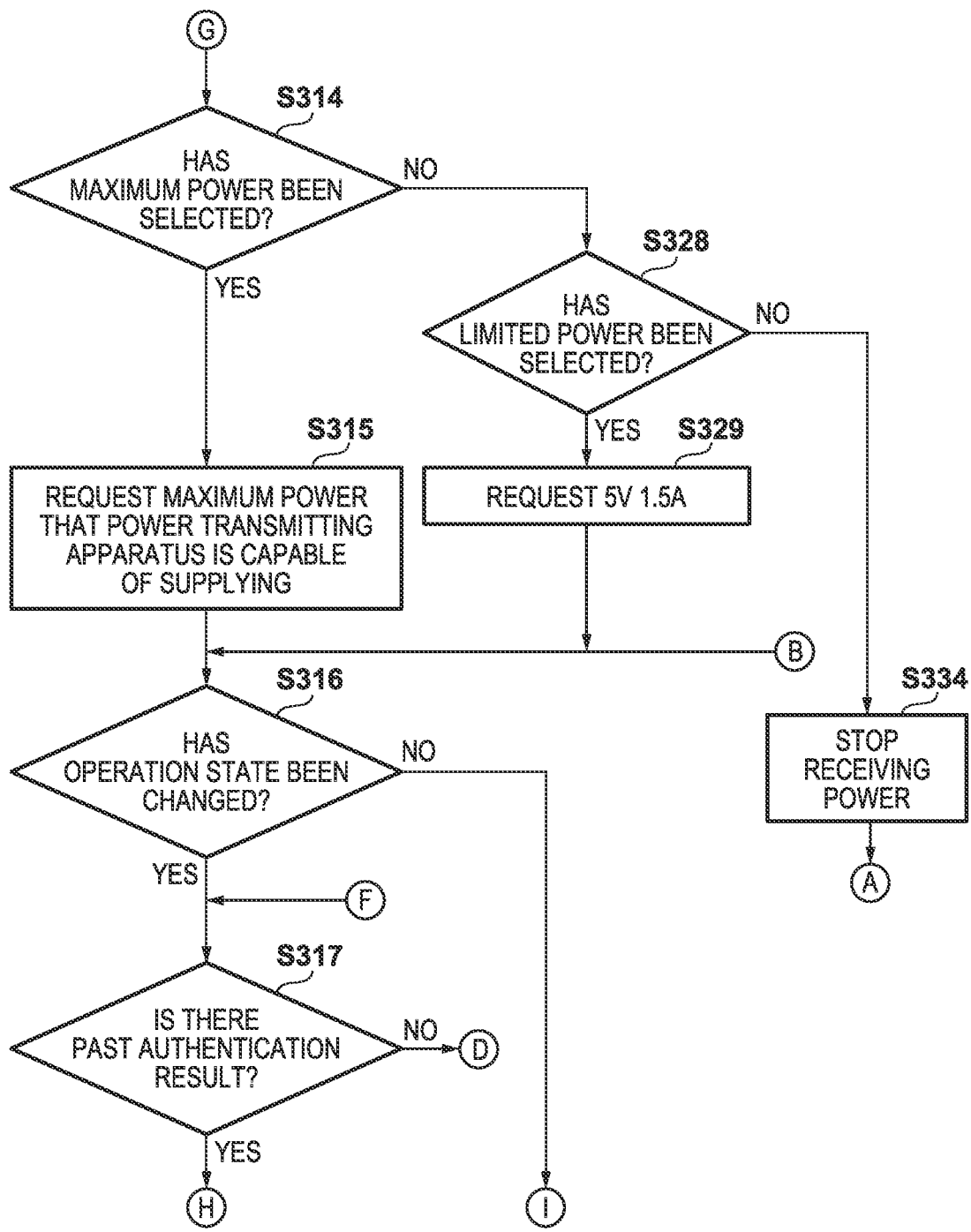
FIG. 3C is a flowchart illustrating the power reception control process according to the first embodiment.
Figure 3D:
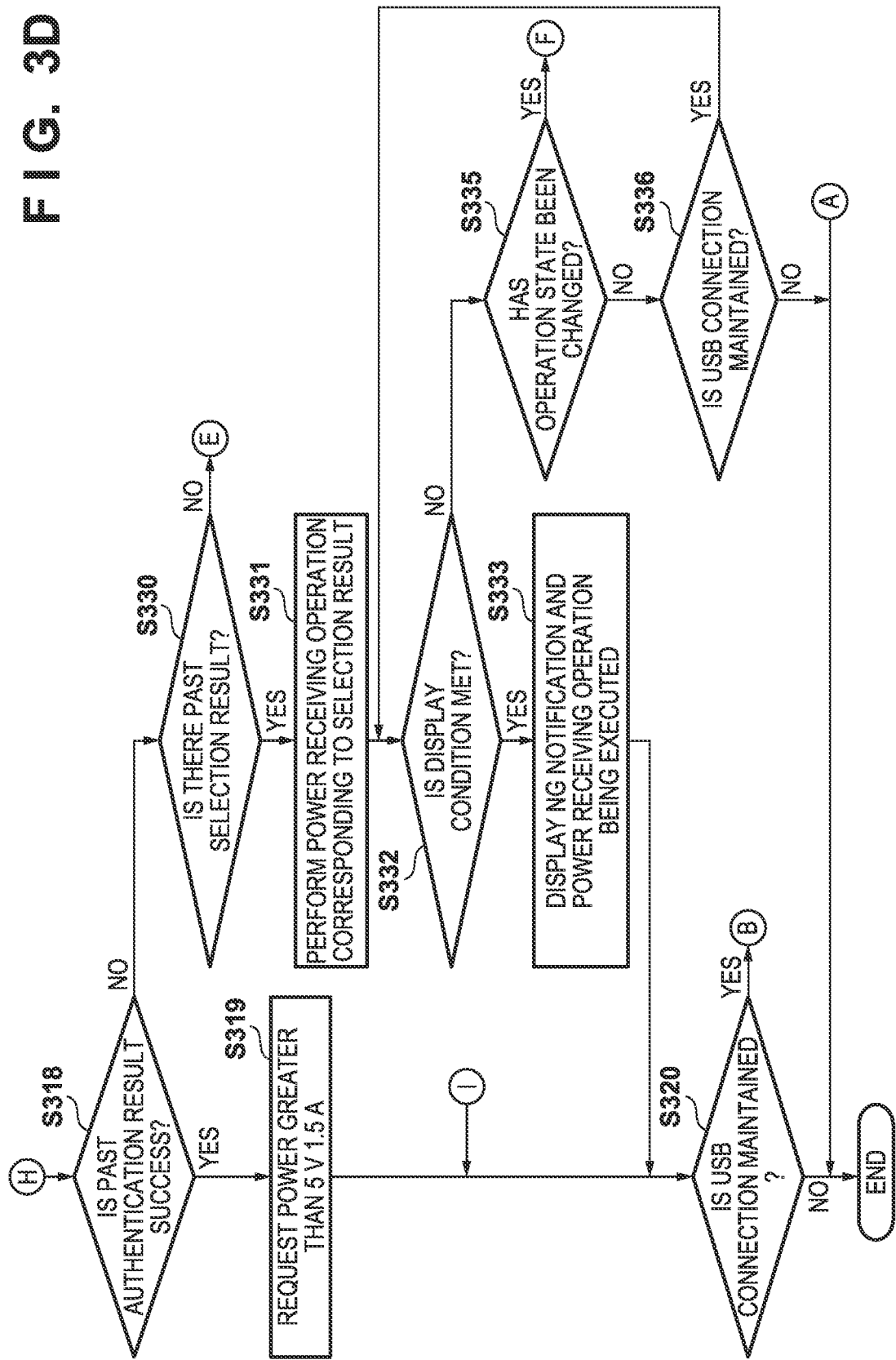
FIG. 3D is a flowchart illustrating the power reception control process according to the first embodiment.

In the second embodiment, the basic system configuration is similar to that in the first embodiment (see FIGS. 1 and 2). The following will primarily describe areas that are different from the first embodiment.

Figure 4A:
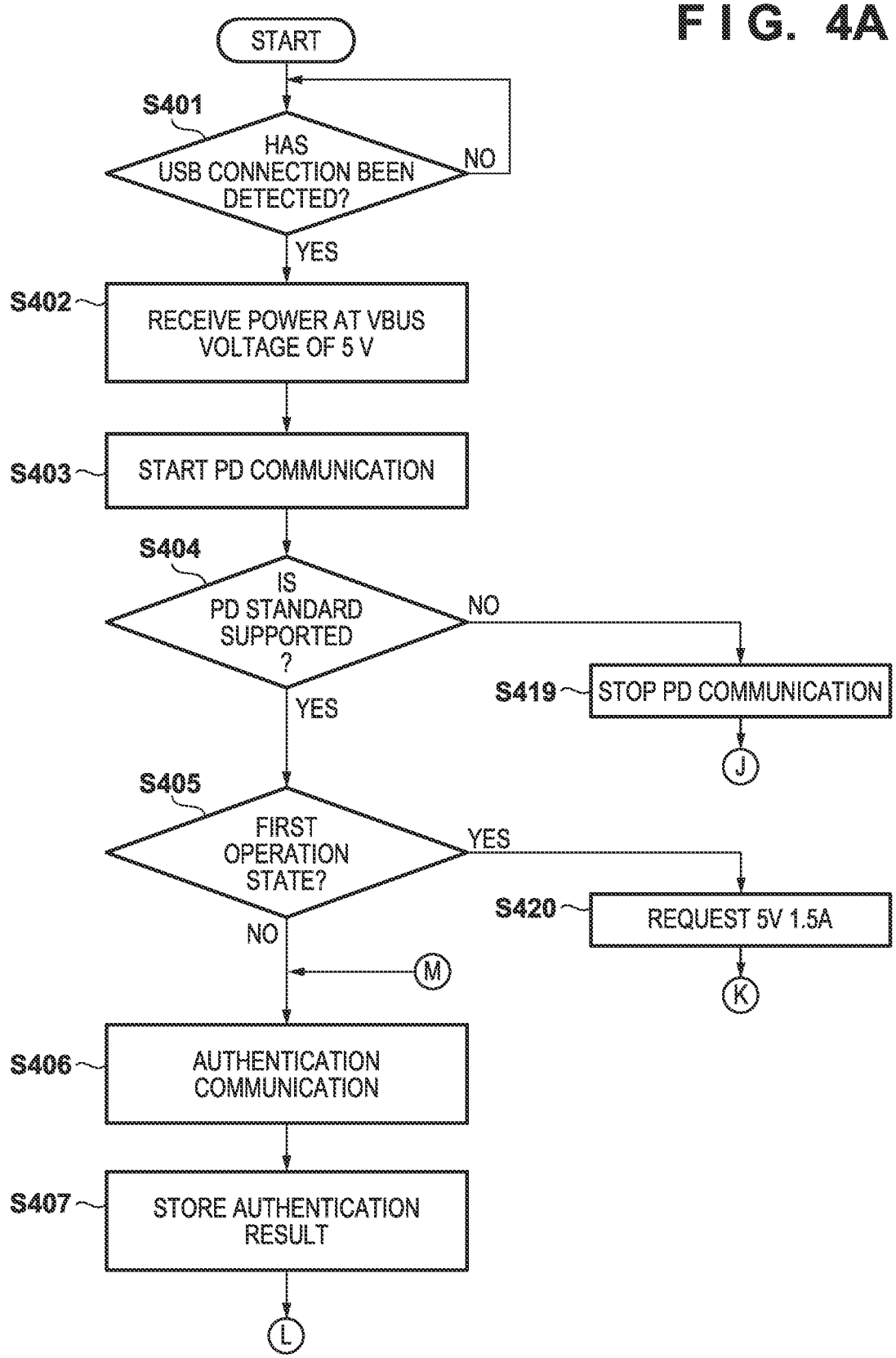
FIG. 4A is a flowchart illustrating a power reception control process according to a second embodiment.
Figure 4B:
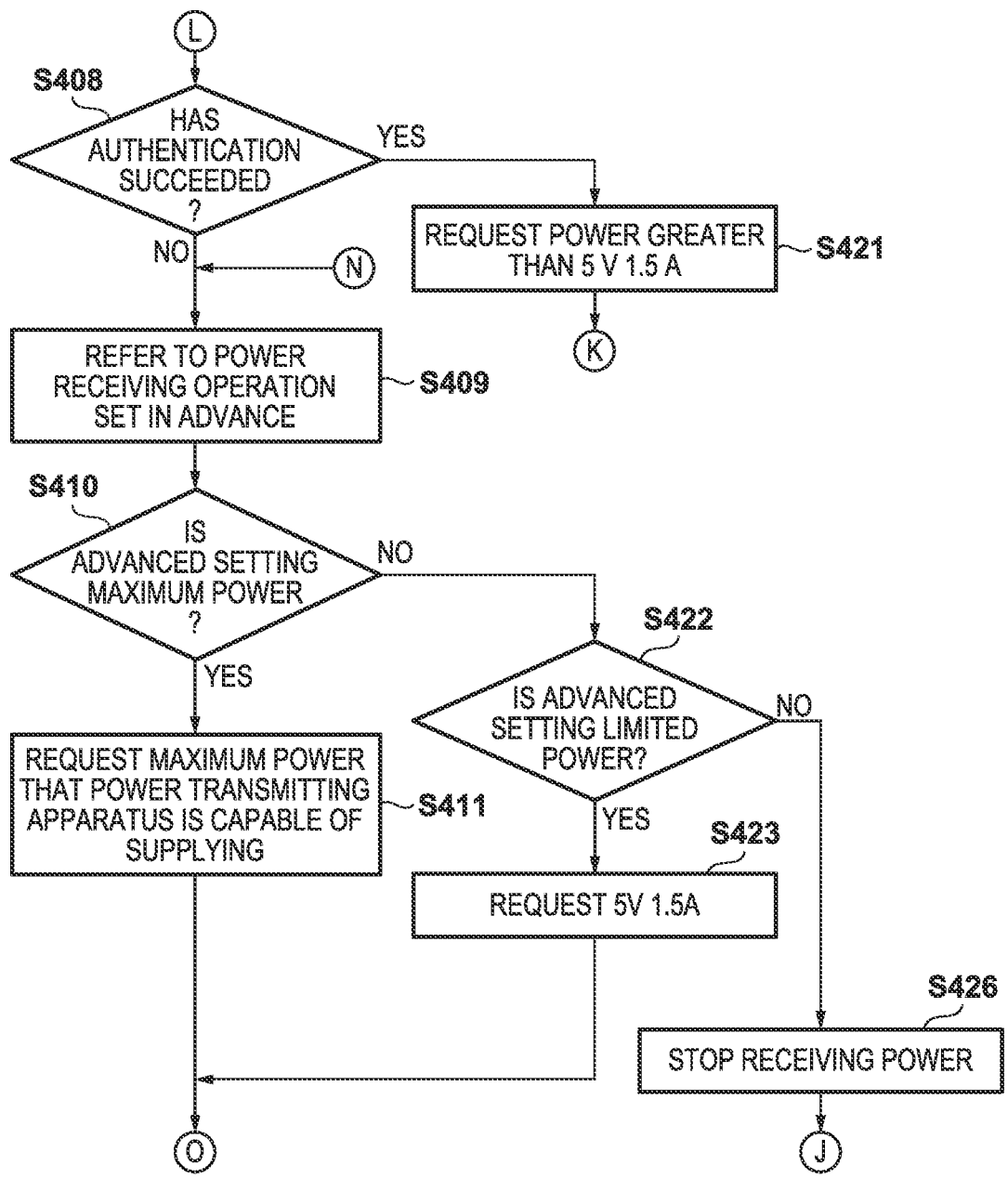
FIG. 4B is a flowchart illustrating the power reception control process according to the second embodiment.

FIGS. 4A to 4C are flowcharts illustrating power reception control process according to the second embodiment. Unless otherwise noted, the power reception control process illustrated in the flowcharts in FIGS. 4A to 4C is performed under the control of the control unit 107.

The processes of steps S401 to S408, S419, S420, and S421 are the same as the processes of steps S301 to S308, S321, S322, and S323 described in the first embodiment, respectively, and will therefore not be described in detail. The descriptions will start from the point where the control unit 107 has failed to authenticate the power transmitting apparatus 120 in step S408 and the power reception control process has proceeded to step S409.

In step S409, the control unit 107 refers to the storage unit 109 and reads out a power receiving operation set in advance. To describe the setting of the power receiving operation stored in the storage unit 109, for example, the user can start up the power receiving apparatus 100 and select a power receiving operation setting before connecting the power receiving apparatus 100 to the power transmitting apparatus 120. The user displays a setting screen by operating the operation unit 110 while viewing the display unit 108, and selects their preferred power receiving operation from among the power receiving operation options. Once a selection has been made, the control unit 107 overwrites the power receiving operation setting in the storage unit 109 with the selected power receiving operation setting.

As in the first embodiment, the power receiving operation options are assumed to be "receive the maximum power the power transmitting apparatus can supply", "receive limited power", and "stop receiving power". If, for example, the user has never performed an operation for setting the power receiving operation, the power receiving apparatus 100 performs a power receiving operation set as a default. The power receiving operation set as a default is, for example, a power receiving operation of "receive limited power" (e.g., a power receiving operation for 5 V 1.5 A). This enables the power receiving apparatus 100 to be used while ensuring a set level of safety.

The processes of steps S410, S411, S422, S423, and S426 are the same as the processes of steps S314, S315, S328, S329, and S334 described in the first embodiment, respectively, and will therefore not be described in detail. However, the power receiving operation referenced in steps S410 and S422 is the power receiving operation set in advance, unlike in steps S314 and S328. The processes of steps S410, S411, S422, S423, and S426 make it possible to implement the power receiving operation read out in step S409.

The processes of steps S412, S413, S424, and S425 are the same as the processes of steps S332, S333, S335, and S336 described in the first embodiment, respectively, and will therefore not be described in detail. However, in the first embodiment, the power receiving operation is displayed in step S333, in light of the fact that the power receiving operation is determined based on a past selection result and the user therefore may not know which power receiving operation the power receiving apparatus 100 is performing. In contrast, in the second embodiment, the power receiving operation is displayed in step S413 in light of the fact that the power receiving operation is determined based on an advanced setting and the user therefore may not know which power receiving operation the power receiving apparatus 100 is performing.

The processes of steps S414 to S418 are the same as the processes of steps S316 to S320 described in the first embodiment, respectively, and will therefore not be described in detail. However, when the past authentication result indicates authentication failure, in the first embodiment, processes relating to the past selection result are performed (e.g., the power reception control process proceeds from step S318 to step S330), whereas in the second embodiment, the power receiving operation set in advance is referenced (the power reception control process proceeds from step S416 to step S409).

As described thus far, according to the second embodiment, the power receiving apparatus 100 sets a power receiving operation, which is to be performed when the power transmitting apparatus 120 is determined not to meet the safety condition, in advance (before the process for determining whether or not the power transmitting apparatus 120 meets the safety condition is performed). When it is determined that the power transmitting apparatus 120 does not meet the safety condition, the power receiving apparatus 100 controls the reception of power from the power transmitting apparatus 120 in accordance with the power receiving operation set in advance. In this manner, when the authentication of the power transmitting apparatus 120 fails, power is received using the power receiving operation set in advance, and thus even if the user does not notice a display in the display unit 108 when the authentication fails, the set power reception operation is immediately applied. In addition, once the user has set the power receiving operation, there is no need for the user to select the power receiving operation when authentication fails.

Third Embodiment

At least one of the various functions, processes, and methods described in the foregoing embodiments can be realized using a program. Hereinafter, in a third embodiment, a program for realizing at least one of the various functions, processes, and methods described in the foregoing embodiment will be called a "program X". Furthermore, in the third embodiments, a computer for executing the program X will be called a "computer Y". A personal computer, a microcomputer, a CPU (Central Processing Unit), or the like are examples of the computer Y.

At least one of the various functions, processes, and methods described in the foregoing embodiments can be realized by the computer Y executing the program X. In this case, the program X is supplied to the computer Y via a computer-readable storage medium. The computer-readable storage medium in the third embodiment includes at least one of a hard disk device, a magnetic storage device, an optical storage device, a magneto-optical storage device, a memory card, ROM, RAM, or the like. Furthermore, the computer-readable storage medium in the third embodiment is a non-transitory storage medium.

While aspects of the disclosure are described with reference to exemplary embodiments, it is to be understood that the aspects of the disclosure are not limited to the exemplary embodiments. The scope of the following claims is to be accorded the broadest interpretation so as to encompass all such modifications and equivalent structures.

This application claims the benefit of Japanese Patent Application No. 2020-139442, filed Aug. 20, 2020, which is hereby incorporated by reference herein in its entirety.

What is claimed is:
1. A power receiving apparatus comprising:
a controller; and
a memory storing a program that, when executed by the controller, causes the power receiving apparatus to function as:
a power receiving unit that receives a first power or a second power higher than the first power from a power transmitting apparatus;
a communication unit that communicates with the power transmitting apparatus and receives, from the power transmitting apparatus, predetermined information regarding a power that can be supplied by the power transmitting apparatus; and
a control unit that controls the power receiving unit and the communication unit,
wherein
the control unit controls the communication unit to send, to the power transmitting apparatus, a request for a power, in accordance with the predetermined information, and the control unit (i) controls the communication unit to send, to the power transmitting apparatus, a request for the first power, without performing a determination process of determining whether or not the power transmitting apparatus meets a predetermined condition, and controls the power receiving unit to receive the first power from the power transmitting apparatus, in a case where the power receiving apparatus is in a first operation state, (ii) performs the determination process of determining whether or not the power transmitting apparatus meets the predetermined condition before the communication unit sends, to the transmitting apparatus, a request for the second power, in a case where the power receiving apparatus is in a second operation state, and (iii) controls the communication unit to send, to the power transmitting apparatus, the request for the second power, and controls the power receiving unit to receive the second power from the power transmitting apparatus, in a case where the power receiving apparatus is in the second operation state and the power transmitting apparatus meets the predetermined condition.

2. The power receiving apparatus according to claim 1, wherein the control unit controls the power receiving unit to receive a third power that does not exceed a predetermined power in a case where the power receiving apparatus is in the first operation state.

3. The power receiving apparatus according to claim 1, wherein the control unit performs the determination process in a case where a change from the first operation state to the second operation state has been detected.

4. The power receiving apparatus according to claim 1, wherein the control unit controls a display unit to display information prompting a user to select a power receiving operation in the display unit in a case where the power transmitting apparatus does not meet the predetermined condition, and controls reception of power from the power transmitting apparatus in accordance with a selected power receiving operation.

5. The power receiving apparatus according to claim 1, wherein the control unit controls reception of power from the power transmitting apparatus in accordance with a predetermined power receiving operation in a case where the power transmitting apparatus does not meet the predetermined condition.

6. The power receiving apparatus according to claim 1, wherein the first operation state is a state in which the power receiving apparatus is powered off, and the second operation state is a state in which the power receiving apparatus is powered on.

7. The power receiving apparatus according to claim 1, further comprising an image capture unit,
wherein the first operation state is a state in which power is not supplied to the image capture unit, and the second operation state is a state in which power is supplied to the image capture unit.

8. The power receiving apparatus according to claim 1, further comprising an authentication unit that performs user authentication,
wherein the first operation state is a state before the user authentication succeeds, and the second operation state is a state after the user authentication succeeds.

9. The power receiving apparatus according to claim 1, wherein the first operation state is a state in which a voltage of a battery connected to the power receiving apparatus is less than a minimum voltage for starting up the power receiving apparatus, and
the second operation state is a state in which the voltage of the battery is greater than the minimum voltage.

10. The power receiving apparatus according to claim 1, wherein the first operation state is a state in which trickle charging of a battery is performed using power supplied from the power transmitting apparatus, and
the second operation state is a state in which the battery is charged using power from the power transmitting apparatus at a current greater than a current of the trickle charging.

11. The power receiving apparatus according to claim 1, wherein
the power receiving unit receives the power from the power transmitting apparatus in accordance with a USB Power Delivery (USB PD) standard,
the communication unit performs communication in accordance with the USB PD standard, and
the determination process is C-AUTH authentication.

12. A method comprising:
controlling a power receiving unit of a power receiving apparatus to receive a first power or a second power higher than the first power from a power transmitting apparatus;
controlling a communication unit to communicate with the power transmitting apparatus and receive, from the power transmitting apparatus, predetermined information regarding a power that can be supplied by the power transmitting apparatus;
controlling the communication unit to send, to the power transmitting apparatus, a request for a power, in accordance with the predetermined information,
controlling the communication unit to send, to the power transmitting apparatus, a request for the first power a power receiving unit of a power receiving apparatus to receive a first power without performing a determination process of determining whether or not the power transmitting apparatus meets a predetermined condition, and controlling the power receiving unit to receive the first power from the power transmitting apparatus, in a case where the power receiving apparatus is in a first operation state;
performing the determination process of determining whether or not the power transmitting apparatus meets the predetermined condition before the communication unit sends, to the transmitting apparatus, a request for the second power, in a case where the power receiving apparatus is in a second operation state; and
controlling the communication unit to send, to the power transmitting apparatus, the request for the second power, and controlling the power receiving unit of the power receiving apparatus to receive the second power from the power transmitting apparatus, in a case where the power receiving apparatus is in the second operation state and the power transmitting apparatus meets the predetermined condition.

13. A non-transitory storage medium that stores a program causing a computer to execute a method, the method comprising:
controlling a power receiving unit of a power receiving apparatus to receive a first power or a second power higher than the first power from a power transmitting apparatus;
controlling a communication unit to communicate with the power transmitting apparatus and receive, from the power transmitting apparatus, predetermined information regarding a power that can be supplied by the power transmitting apparatus;

controlling the communication unit to send, to the power transmitting apparatus, a request for a power, in accordance with the predetermined information, controlling the communication unit to send, to the power transmitting apparatus, a request for the first power without performing a determination process of determining whether or not the power transmitting apparatus meets a predetermined condition, and controlling the power receiving unit to receive the first power from the power transmitting apparatus, in a case where the power receiving apparatus is in a first operation state;

performing the determination process of determining whether or not the power transmitting apparatus meets the predetermined condition before the communication unit sends, to the transmitting apparatus, a request for the second power, in a case where the power receiving apparatus is in a second operation state; and controlling the communication unit to send, to the power transmitting apparatus, the request for the second power, and controlling the power receiving unit of the power receiving apparatus to receive the second power from the power transmitting apparatus, in a case where the power receiving apparatus is in the second operation state and the power transmitting apparatus meets the predetermined condition.

* * * * *